(12) United States Patent
Zhang

(10) Patent No.: US 10,991,863 B2
(45) Date of Patent: Apr. 27, 2021

(54) LIGHT-EMITTING DIODE PACKAGE STRUCTURE AND MANUFACTURING METHOD THEREOF

(71) Applicant: KAISTAR Lighting(Xiamen) Co., Ltd., Xiamen (CN)

(72) Inventor: Shao-Feng Zhang, Xiamen (CN)

(73) Assignee: KAISTAR LIGHTING(XIAMEN) CO., LTD., Xiamen (CN)

( * ) Notice: Subject to any disclaimer, the term of this patent is extended or adjusted under 35 U.S.C. 154(b) by 0 days.

(21) Appl. No.: 16/458,593

(22) Filed: Jul. 1, 2019

(65) Prior Publication Data
US 2019/0326495 A1 Oct. 24, 2019

(30) Foreign Application Priority Data

Aug. 29, 2018 (CN) .......................... 201810995355.7

(51) Int. Cl.
*H01L 33/62* (2010.01)
*H05B 45/30* (2020.01)
(Continued)

(52) U.S. Cl.
CPC .............. *H01L 33/62* (2013.01); *H01L 33/54* (2013.01); *H05B 45/00* (2020.01); *H05B 45/30* (2020.01); *H05B 45/39* (2020.01); *H01L 2933/005* (2013.01); *H01L 2933/0033* (2013.01); *H01L 2933/0066* (2013.01)

(58) Field of Classification Search
CPC ......... H01L 33/62; H01L 33/54; H01L 23/49; H01L 25/0753; H01L 2933/033; H01L 2933/005; H01L 2933/0066; G05F 1/20; G05F 1/30; G05F 1/10; G05F 1/02; G05F 1/56; G05F 1/461; G05F 1/618; G01F 1/613; H05B 45/00; H05B 45/30;
(Continued)

(56) References Cited

U.S. PATENT DOCUMENTS 6,305,818 B1 * 10/2001 Lebens .................. H05B 45/37
362/184
8,810,155 B2 * 8/2014 Kamada ............... H05B 47/165
315/297
(Continued)

FOREIGN PATENT DOCUMENTS

CN          106206559 A        12/2016

*Primary Examiner* — Galina G Yushina
(74) *Attorney, Agent, or Firm* — Li & Cai Intellectual Property (USA) Office

(57) ABSTRACT

A light-emitting diode package structure and a manufacturing method thereof are provided. The light-emitting diode package structure includes a first substrate, a second substrate, a light-emitting module, and a driving module. The first substrate includes a light-emitting region defined thereon and a load circuit configured in the light-emitting region. The second substrate includes a control region defined thereon and a driving circuit configured in the control region. The first substrate and the second substrate are spaced apart from each other. The light-emitting module is disposed on the first substrate and electrically connected to the load circuit. The driving module is disposed on the second substrate and electrically connected to the driving circuit. The driving module is electrically connected to the light-emitting module.

12 Claims, 14 Drawing Sheets

(51) Int. Cl.
*H05B 45/00* (2020.01)
*H01L 33/54* (2010.01)
*H05B 45/39* (2020.01)

(58) Field of Classification Search
CPC ........ H05B 45/39; H05B 45/40; H05B 45/46; H04B 47/00
See application file for complete search history.

(56) References Cited

U.S. PATENT DOCUMENTS

| | | | |
|---|---|---|---|
| 8,823,271 B2* | 9/2014 | van de Ven | H05B 45/44 |
| | | | 315/188 |
| 9,295,117 B2* | 3/2016 | Acatrinei | H05B 45/382 |
| 9,585,221 B1* | 2/2017 | Chen | H05B 45/50 |
| 9,621,137 B2* | 4/2017 | Imanaka | H05B 45/37 |
| 10,228,095 B2* | 3/2019 | Liang | F21K 9/237 |
| 2014/0043875 A1* | 2/2014 | Hsing | H02M 7/2176 |
| | | | 363/77 |
| 2016/0320042 A1* | 11/2016 | Hsing Chen | H05K 1/144 |
| 2017/0102508 A1* | 4/2017 | Yoda | G02B 6/4221 |
| 2017/0257928 A1* | 9/2017 | Hsia | H02M 1/4233 |

\* cited by examiner

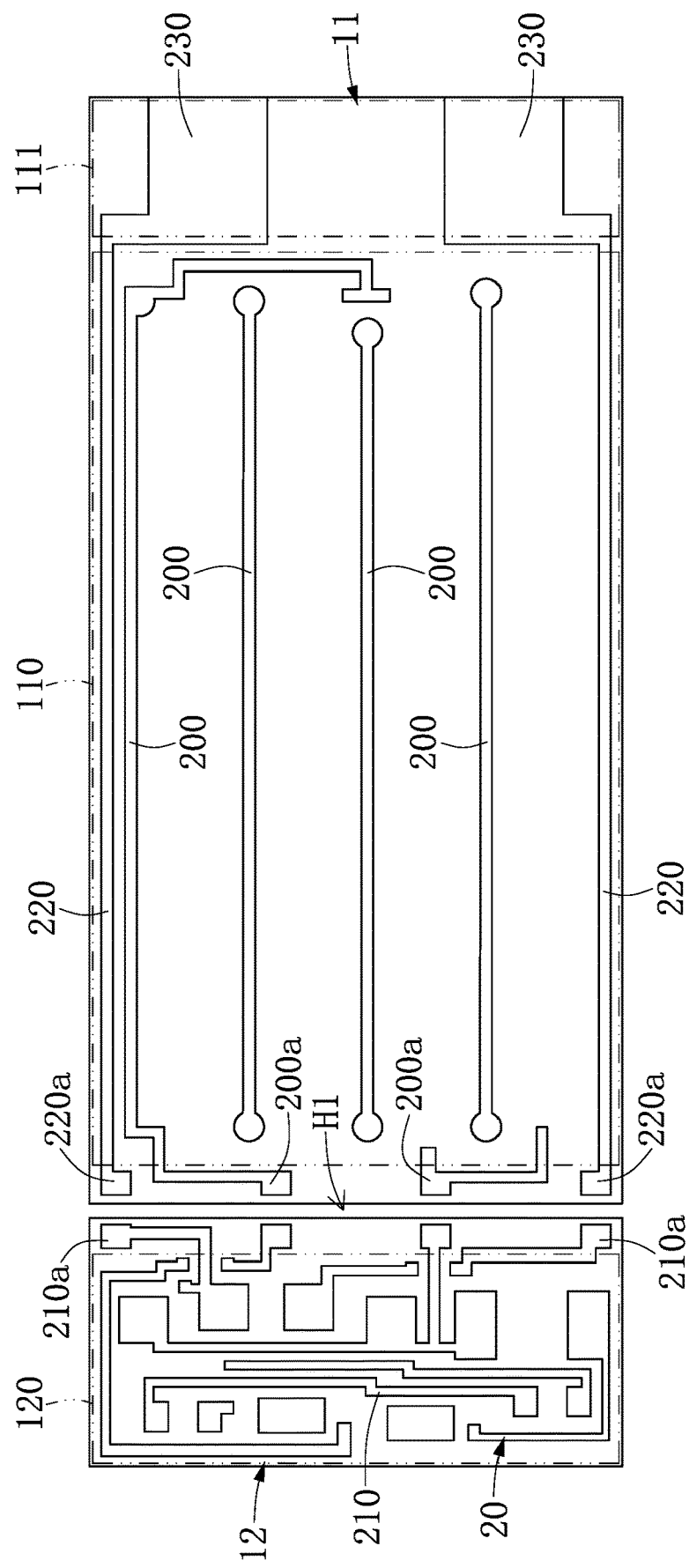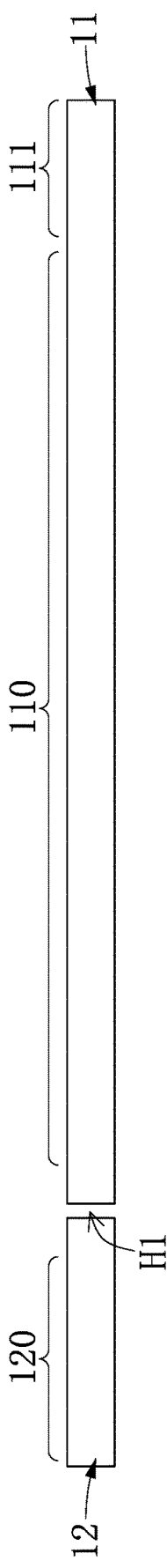
FIG. 3A
FIG. 3B

LIGHT-EMITTING DIODE PACKAGE STRUCTURE AND MANUFACTURING METHOD THEREOF

CROSS-REFERENCE TO RELATED PATENT APPLICATION

This application claims the benefit of priority to China Patent Application No. 201810995355.7, filed on Aug. 29, 2018 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light-emitting diode (LED) package structure and a manufacturing method thereof, and more particularly to a light-emitting diode (LED) package structure with higher stability and a manufacturing method thereof

BACKGROUND OF THE DISCLOSURE

Recently, a light-emitting diode (LED) are widely used in different kinds of illumination devices or display devices, such as ceiling lamps, downlights, pendant lamps, bulb lights, indicators, reading lamps, flashlights, backlights of a display panel, and so on.

However, a lot of heat may be generated by a plurality of LED units of an LED module during the operation of the LED module, which may adversely affect the stability of a control chip or the other electronic components, so that the lifetime of the product is reduced.

Accordingly, providing an LED module which can be driven by grid power, has smaller volume, and has higher luminous efficiency and stability is still an aim in the relevant industry.

SUMMARY OF THE DISCLOSURE

In response to the above-referenced technical inadequacies, the present disclosure provides a light-emitting diode package structure and a manufacturing method thereof so as to prevent a drive module and a light-emitting module from being affected by thermal effects caused by heat generated during the operation of the light-emitting diode package structure.

In one aspect, the present disclosure provides a light-emitting diode package structure. The light-emitting diode package structure includes a first substrate, a second substrate, a light-emitting module, and a driving module. The first substrate includes a light-emitting region and a load circuit configured in the light-emitting region. The second substrate includes a control region and a driving circuit configured in the control region. The first substrate and the second substrate are spaced apart from each other. The light-emitting module is disposed on the first substrate and electrically connected to the load circuit. The driving module is disposed on the second substrate and electrically connected to the driving circuit. The driving module is electrically connected to the light-emitting module.

In one aspect, the present disclosure provides a manufacturing method of a light-emitting diode package structure. A first substrate and a second substrate which are separate from each other are provided, in which the first substrate includes a light-emitting region defined thereon and a load circuit configured in the light-emitting region, and the second substrate includes a control region defined thereon and a driving circuit configured in the control region. An assembling step is performed so that a light-emitting module and a driving module are respectively mounted on the first substrate and the second substrate, and the light-emitting module and the driving module are electrically connected to each other by at least one electrical connection unit.

Therefore, in a light-emitting diode package structure and a manufacturing method thereof provided in the present disclosure, by spacing apart the first substrate, on which the light-emitting module is disposed, from the second substrate, on which the driving module is disposed, the thermal effects respectively caused by either one of the light-emitting module and the driving module during operation on the other one of the light-emitting module and the driving module can be reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 3A is a schematic top view of a light-emitting diode package structure during the step S100 according to the embodiment of the present disclosure.

FIG. 3B is a schematic side view of a light-emitting diode package structure during the step S100 according to the embodiment of the present disclosure.

DETAILED DESCRIPTION OF THE EXEMPLARY EMBODIMENTS

Figure 1:
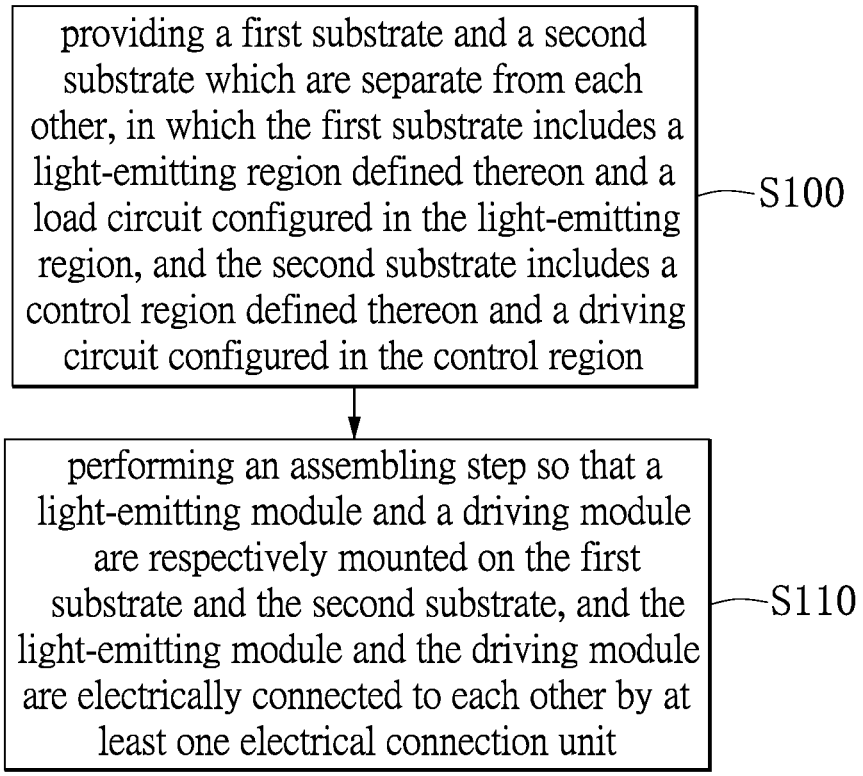
FIG. 1 is a flowchart of a manufacturing method of a light-emitting diode package structure according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1. FIG. 1 is a flowchart of a manufacturing method of a light-emitting diode package structure according to an embodiment of the present disclosure. The manufacturing method of a light-emitting diode package structure at least includes the following steps.

In the step S100, a first substrate and a second substrate which are separate from each other are provided, in which the first substrate includes a light-emitting region defined thereon and a load circuit configured in the light-emitting region, and the second substrate includes a control region defined thereon and a driving circuit configured in the control region.

In the step S110, an assembling step is performed so that a light-emitting module and a driving module are respectively mounted on the first substrate and the second substrate, and the light-emitting module and the driving module are electrically connected to each other by at least one electrical connection unit.

The details of the manufacturing method of a light-emitting diode package structure according to an embodiment of the present disclosure will be further described. Reference is made to FIGS. 2A, 2B, 3A and 3B, which shows the details of the step of providing the first substrate and the second substrate.

Figure 2A:
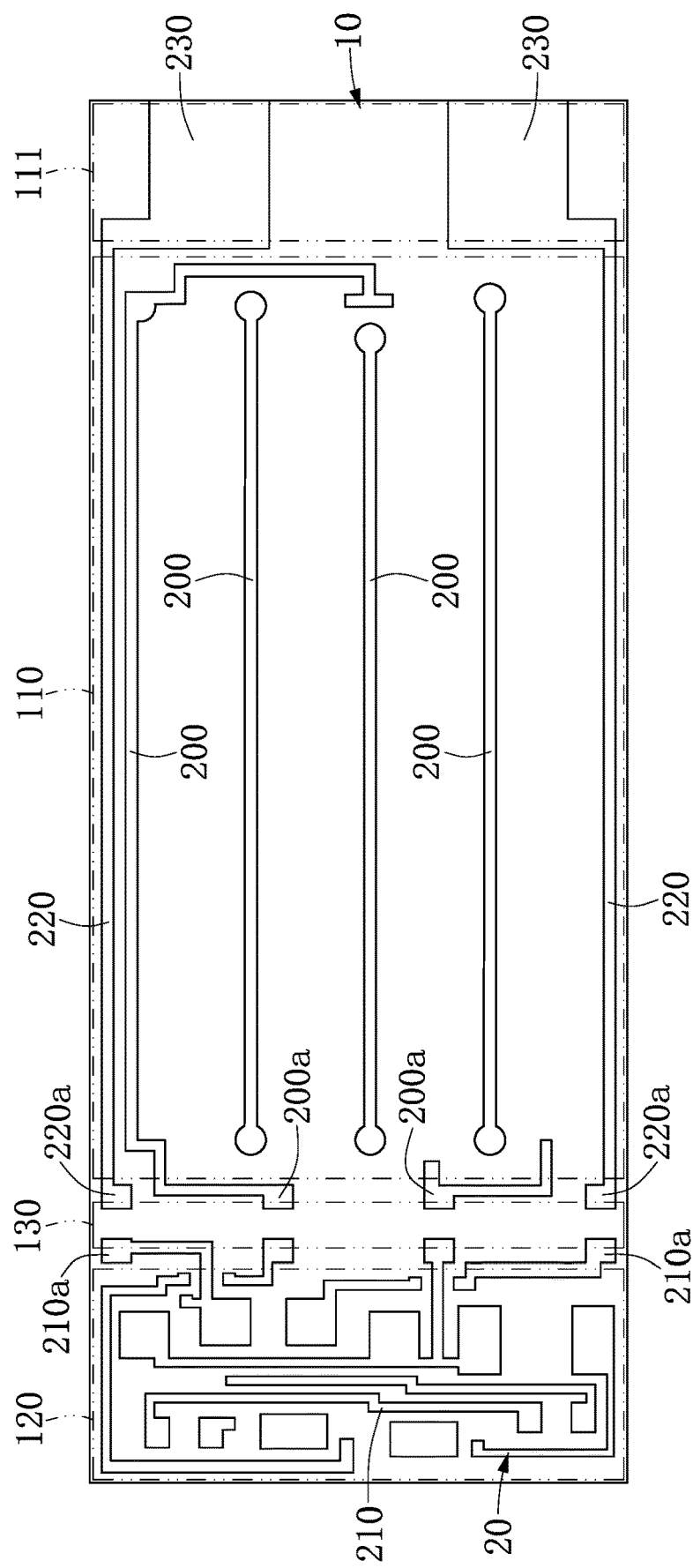
FIG. 2A is a schematic top view of a light-emitting diode package structure during the step S100 according to the embodiment of the present disclosure.
Figure 2B:
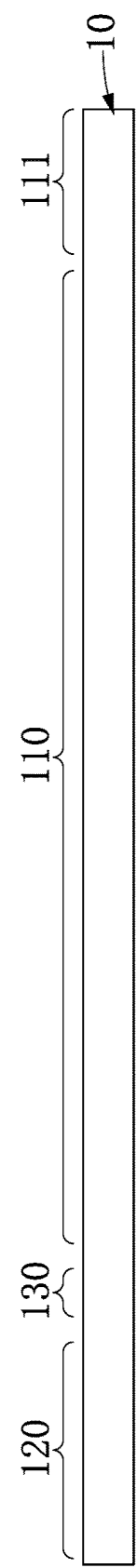
FIG. 2B is a schematic side view of a light-emitting diode package structure during the step S100 according to the embodiment of the present disclosure.

As shown in FIG. 2A, in the instant embodiment, an initial substrate 10 is provided, in which the initial substrate 10 has a light-emitting region 110, a control region 120 and a cutting region 130, and the cutting region 130 is located between the light-emitting region 110 and the control region 120. The initial substrate 10 is made of a heat-resistant and insulated material, such as ceramic or sapphire.

Furthermore, a circuit layout 20 is formed on the initial substrate 10. The circuit layout 20 includes a plurality of traces, and the traces can be configured in the control region 120 and in the light-emitting region 110 according to the practical implementations so that the electronic components which will be disposed in the control region 120 and in the light-emitting region 110 in the following steps can be electrically connected to one another. In one embodiment, the traces are made of silver. Each of the traces has a width at least greater than 0.12 mm and a thickness at least greater than 10 µm.

The circuit layout 20 includes a load circuit 200 configured in the light-emitting region 110 and a driving circuit 210 configured in the control region 120. In the instant embodiment, the cutting region 130 is not configured with any circuit.

In the instant embodiment, the load circuit 200 further includes a plurality of first pads 200a which are disposed adjacent to the cutting region 130, and the driving circuit 210 includes a plurality of second pads 210a which are disposed adjacent to the cutting region 130. The second pads 210a respectively correspond to the first pads 200a.

As shown in FIG. 2A, in the instant embodiment, a welding region 111 is further defined on the initial substrate 10, and the welding region 111 is spaced apart from the control region 120 by the light-emitting region 110. That is to say, the welding region 111 and the control region 120 are respectively located at two opposite sides of the light-emitting region 110.

Accordingly, the circuit layout 20 further includes two power receiving pads 230 and the two jumper wires 220. The two power receiving pads 230 are disposed in the welding region 111 and respectively electrically connected to the two jumper wires 220. To be more specific, the two jumper wires 220 respectively extend from the two power receiving pads 230 into the light-emitting region 110 so as to connect to two of the first pads 200a, respectively.

Reference is made to FIG. 3A and FIG. 3B. The initial substrate 10 is cut along the cutting region 130 into a first substrate 11 and a second substrate 12, which are separated from each other. The aforementioned light-emitting region 110 and the welding region 111 are both located at the first substrate 11, and the control region 120 is located at the second substrate 12.

In other words, the light-emitting region 110 and the control region 120 are respectively located at different substrates. Accordingly, the load circuit 200 configured in the light-emitting region 110 is disposed on the first substrate 11, and the driving circuit 210 configured in the control region 120 is disposed on the second substrate 12.

Figure 4A:
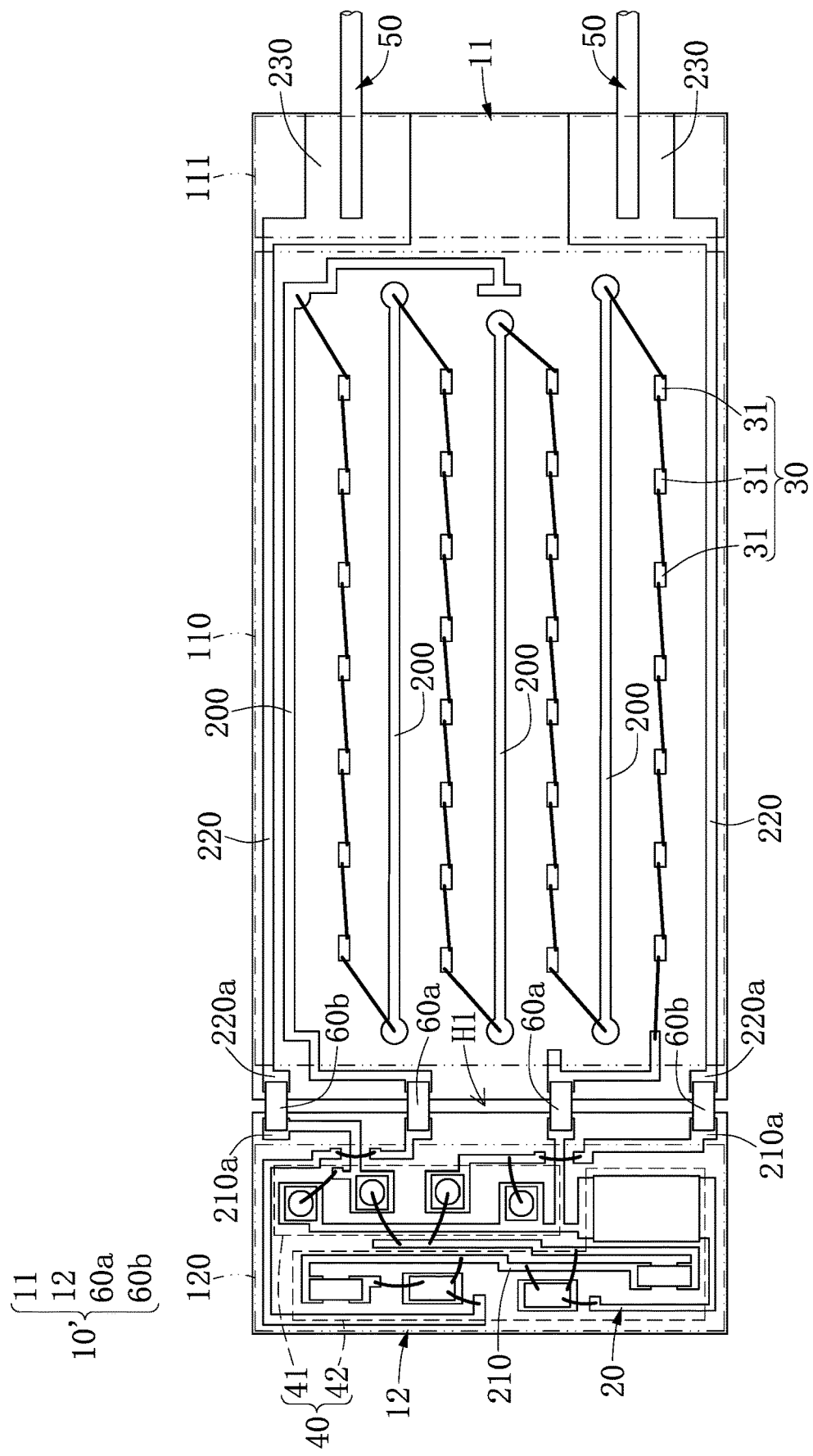
FIG. 4A is a schematic top view of a light-emitting diode package structure during the step S110 according to the embodiment of the present disclosure.
Figure 4B:
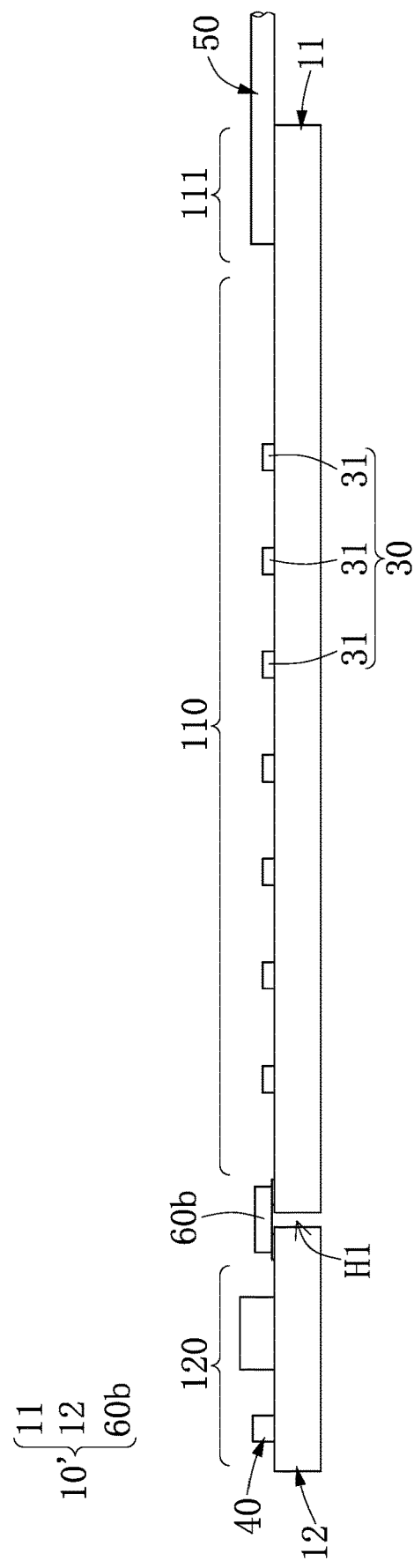
FIG. 4B is a schematic side view of a light-emitting diode package structure during the step S110 according to the embodiment of the present disclosure.

Reference is made to FIG. 4A and FIG. 4B. FIG. 4A and FIG. 4B respectively show a schematic top and side views of a light-emitting diode package structure in step S110 according to the embodiment of the present disclosure.

In the assembling step, the light-emitting module 30 and the driving module 40 are respectively disposed on the first substrate 11 and the second substrate 12. In the instant embodiment, the light-emitting module 30 includes a plurality of light-emitting units 31, in which the light-emitting unit 31 is a light-emitting diode.

The light-emitting units 31 can be mounted on the first substrate 11 by a wire bonding process or a flip-chip bonding process and electrically connected to the load circuit 200. In the instant embodiment, the light-emitting units 31 are configured in the light-emitting region 110 and electrically connected to one another by the load circuit 200, which has been configured in the light-emitting region 110 during the previous step, and a plurality of bonding wires.

Specifically, the light-emitting units 31 of the light-emitting module 30 can be electrically connected in series or in parallel according to a practical circuit design. In the instant embodiment, the light-emitting module 30 includes a plurality of light-emitting units 31, which are electrically connected to one another in series by the bonding wires and the load circuit 200. However, in another embodiment, the light-emitting module 30 can include two groups which are electrically connected in parallel, and each of the groups further includes a plurality of light-emitting units 31 which are electrically connected to one another in series.

That is to say, by varying the configurations of the bonding wires or the pattern design of the load circuit 200, the electrical connections among the light-emitting units 31 of the light-emitting module 30 can be varied. Accordingly, the connection of the light-emitting units 31 illustrated in FIG. 4A is only an example for describing one of the embodiments of the present disclosure, and not intended to limit the present disclosure.

Figure 6:
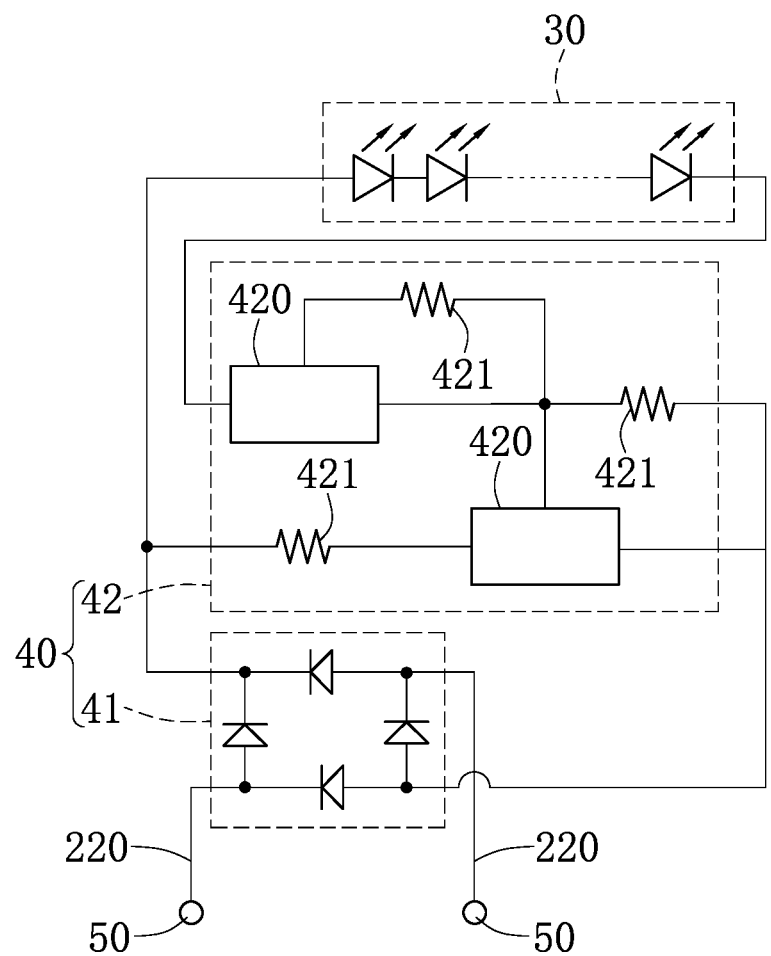
FIG. 6 is a diagram showing a driving circuit of the light-emitting diode package structure shown in FIG. 5B according to the embodiment of the present disclosure.

On the other hand, in the instant embodiment, the driving module 40 is disposed in the control region 120 and electrically connected to the driving circuit 210. In the instant embodiment, the driving module 40 can include a dimming circuit 42 and a bridge rectifier circuit 41. As shown in FIG. 4A, FIG. 4B and FIG. 6, the dimming circuit 42 can include two control chips 420 and a plurality of resistors 421 which are electrically connected to the control chips 420. In another embodiment, the dimming circuit 42 can be replaced with a general control circuit. The bridge rectifier circuit 41 can include a plurality of rectifiers, such as diodes.

It should be noted that the control chips 420 and the resistors 421 of the dimming circuit 42, and the rectifiers of the bridge rectifier circuit 41 can be mounted on the second substrate 12 by a wire bonding process or a flip-chip bonding process, and can be electrically connected to one another through the driving circuit 210.

In the assembling step, the driving module 40 is electrically connected to the light-emitting module 30 by at least one electrical connection unit. In the instant embodiment, the electrical connection unit includes a plurality of conductive connection portions 60a, 60b, and the conductive connection portions 60a, 60b are connected between the first substrate 11 and the second substrate 12.

Furthermore, the first substrate 11 and the second substrate 12 are spaced apart from each other by a predetermined distance, instead of being in direct contact with each other. In the instant embodiment, the first substrate 11 and the second substrate 12 are spaced apart from each other to define an isolation trench H1, as shown in FIG. 4A and FIG. 4B. The width of the isolation trench H1 is not limited in the present disclosure and can be adjusted according to the manner of connection between the first and second substrates 11, 12. In one embodiment, the isolation trench H1 has the width, i.e., the predetermined distance, ranging from 0.1 mm to 0.5 mm.

In the present disclosure, by separating the first substrate 11 that is disposed with the light-emitting module 30 from the second substrate 12 that is disposed with the driving module 40, the thermal effect generated during the operation of the light-emitting module 30 and negatively affecting the control chips 420 can be reduced.

As shown in FIG. 4A and FIG. 4B, each of the conductive connection portions 60a, 60b bridges the isolation trench H1 and is connected between the first substrate 11 and the second substrate 12, such that the light-emitting module 30 is electrically connected to the driving module 40. In the instant embodiment, each of the conductive connection portions 60a, 60b can be a zero-ohm resistor, a metal wire or a flexible board with conductive wires.

It should be noted that in one embodiment, the conductive connection portions 60a, 60b are zero-ohm resistors or jumpers, which not only establish an electrical connection between the driving module 40 and the light-emitting module 30, but also strengthen the mechanical strength between the first substrate 11 and the second substrate 12. In another embodiment, these conductive connection portions 60a, 60b can be conductive wires, and only used for electrically connecting the driving module 40 to the light-emitting module 30. In this situation, during the assembling step, the first and second substrates 11, 12 can be physically connected to each other by other connectors, such as an adhesive. Accordingly, the connection of the first and second substrates 11, 12 is not limited to the example provided herein.

That is to say, the aforementioned connection of the first and second substrates 11, 12 is not intended to limit the present disclosure. In another embodiment, the electrical connection unit can be a dismountable connector. Furthermore, the first substrate 11 and the second substrate 12 can be separated along a horizontal direction (as the arrangement thereof shown in FIGS. 4A and 4B), or along a vertical direction. That is to say, as long as the first and second substrates 11, 12 are not in direct contact with each other, the demands of the present disclosure is met, and the position of the second substrate 12 relative to that of the first substrate 11 is not limited to the example provided herein.

In the instant embodiment, two ends of at least one conductive connection portion 60a are respectively connected to the corresponding first pad 200a and the corresponding second pad 210a so that the driving circuit 210 is electrically connected to the load circuit 200. Furthermore, two terminals of the bridge rectifier circuit 41 are respectively electrically connected to the two power receiving pads 230 through the two jumper wires 220, which are respectively connected to the corresponding conductive connection portions 60b.

In the assembling step, two power receiving terminals 50 for being electrically connected to a drive power supply (not shown in the figures) are further mounted in the welding region 111 through the two power receiving pads 230, respectively.

Since the position of the welding region 111 is farther away from the second substrate 12 than that of the light-emitting region 110, the two power receiving terminals 50 are respectively connected to two of the conductive connection portions 60b through the two jumper wires 220, with the two jumper wires 220 extending across the light-emitting region 110. As such, the two power receiving terminals 50 can be electrically connected to the driving module 40.

To be more specific, in the instant embodiment, by the arrangements of the jumper wires 220 and the conductive connection portions 60a, 60b, the bridge rectifier circuit 41 and the dimming circuit 42 can receive the driving signals, such as driving voltage or driving currents, transmitted from the drive power supply and regulate the current that is input to the light-emitting module 30.

It should be noted that in the assembling step, the sequence for performing the procedures of mounting the light-emitting module 30 and the power receiving terminals 50 on the first substrate 11, mounting the driving module 40 on the second substrate 12, and mounting the conductive connection portions 60a, 60b is not limited in the present disclosure.

In one embodiment, after the light-emitting module 30, the driving module 40, the conductive connection portions 60a, 60b, and the power receiving terminals 50 are respectively arranged on their predetermined positions, a welding process is performed so that the light-emitting module 30, the driving module 40, the conductive connection portions 60a, 60b, and the power receiving terminals 50 are fixed on the first substrate 11 and the second substrate 12, respectively. A wire bonding process is then performed so that the light-emitting module 30, the driving module 40, the conductive connection portions 60a, 60b, and the power receiving terminals 50 are electrically connected to one another.

The steps of manufacturing method of a light-emitting diode package structure are not limited to the abovementioned embodiments. In another embodiment, after the light-emitting module 30 is mounted on the first substrate 11 which has been disposed with the load circuit 200, and the driving module 40 is mounted on the second substrate 12 which has been disposed with the driving circuit 210, the first substrate 11 is assembled to the second substrate 12. Furthermore, it is not necessary for the first and second substrates 11, 12 to have the same material.

Figure 5A:
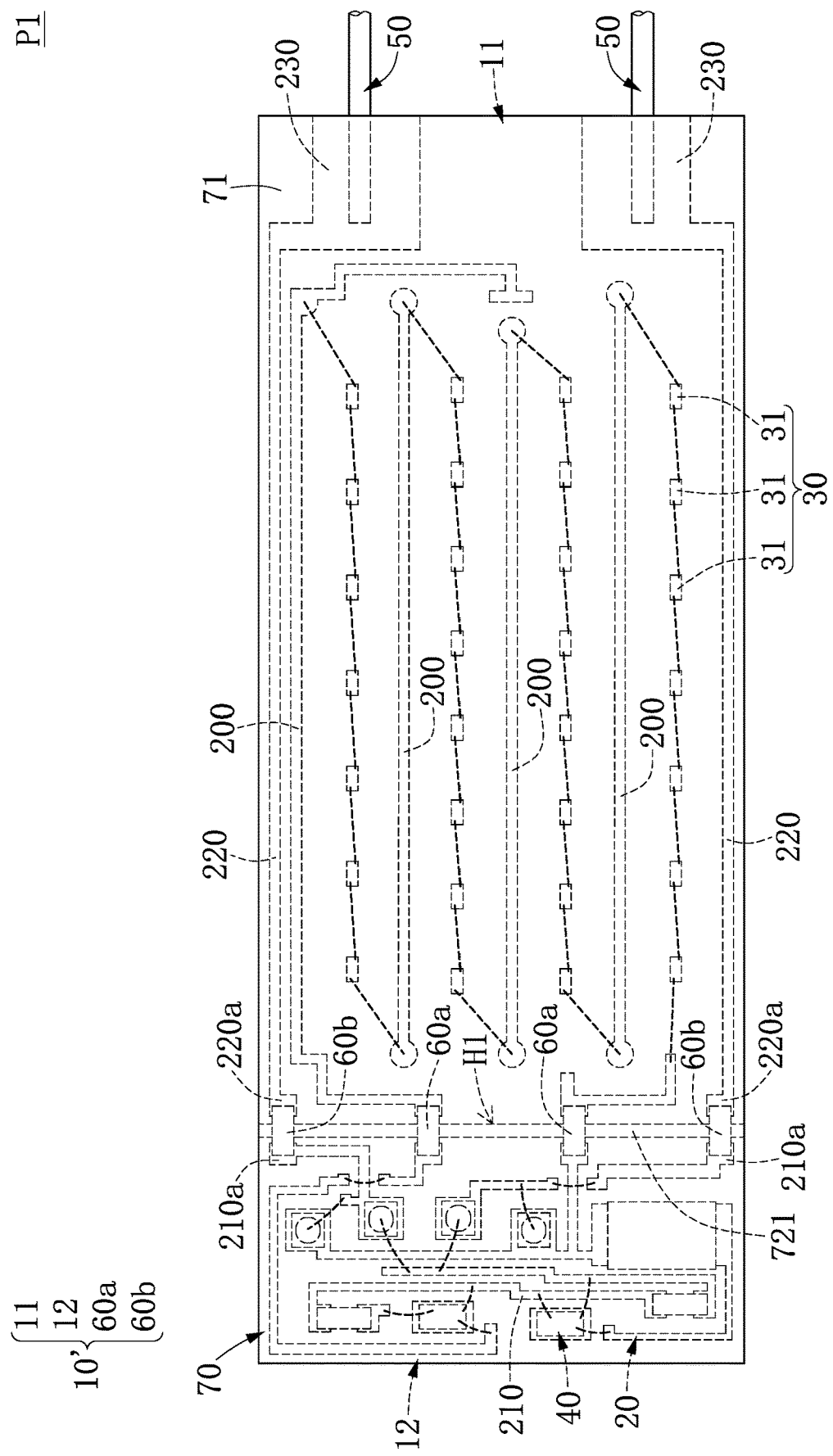
FIG. 5A is a schematic top view of a light-emitting diode package structure according to the embodiment of the present disclosure.
Figure 5B:
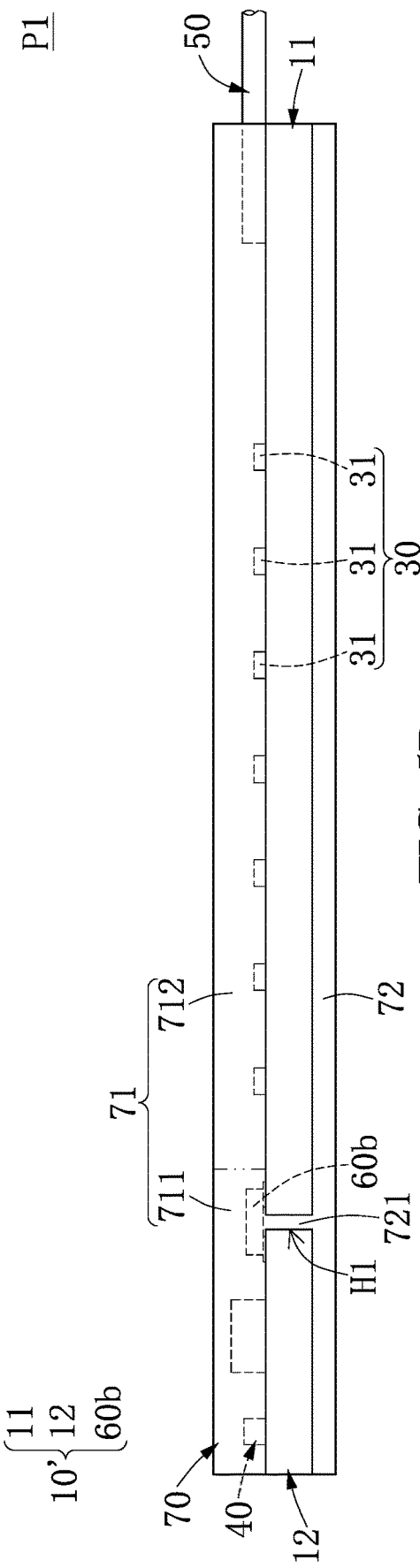
FIG. 5B is a schematic side view of the light-emitting diode package structure according to the embodiment of the present disclosure.

Reference is made to FIG. 5A and FIG. 5B. FIG. 5A and FIG. 5B respectively show schematic top and side views of a light-emitting diode package structure according to the embodiment of the present disclosure.

In the embodiment of the present invention, the manufacturing method of light-emitting diode package structure further includes a step of forming an encapsulating layer 70 at least covering the light-emitting module 30 and the driving module 40. In one embodiment, the encapsulating layer 70 can be formed by an injection molding process or the other conventional techniques.

As shown in FIG. 5A and FIG. 5B, the encapsulating layer 70 covers an upper surface and a bottom surface of a substrate assembly 10'. The encapsulating layer 70 includes an upper portion 71 and a lower portion 72. The upper portion 71 covers the upper surface of the substrate assembly 10' which includes the first and second substrates 11, 12. The lower portion 72 covers the bottom surface of the substrate assembly 10'. Furthermore, in the instant embodiment, it is not necessary for the encapsulating layer 70 to cover the side surface and the bottom surface of the substrate assembly 10'.

Specifically, the upper portion 71 of the encapsulating layer 70 can be divided into a first part 711 covering the control region 120 and a second part 712 covering the light-emitting region 110. It is not necessary for the first and second parts 711, 712 to have the same material. The material of the first part 711 can be phosphor adhesive, transparent adhesive, or opaque adhesive, and the material of the second part 712 can be phosphor adhesive or transparent adhesive.

In one embodiment, the material of the first part 711 is the same as that of the second part 712, i.e., both of the first and second parts 711, 712 are made of transparent adhesive or phosphor adhesive. In another embodiment, the material of the first part 711 is opaque adhesive, such as rubber latex or opaque rubber, and the material of the second part 712 is phosphor adhesive or transparent adhesive.

Furthermore, in one embodiment, during the injection molding process for forming the encapsulating layer 70, a portion of the molding material fills into the isolation trench H1, thereby forming an isolation portion 721. That is to say, the material of the isolation portion 721 is the same as that of the encapsulating layer 70. In another embodiment, the bottom surface of the substrate assembly 10' is not covered by the encapsulating layer 70 and exposed. In this situation, the isolation trench H1 is filled with air.

As shown in FIG. 5A, based on the mentioned above, a light-emitting diode package structure P1 of an embodiment of the present disclosure includes a substrate assembly 10', a light-emitting module 30 and a driving module 40. The substrate assembly 10' includes a first substrate 11, a second substrate 12 and at least one electrical connection unit. Furthermore, the first and second substrates 11, 12 are spaced apart from each other to define an isolation trench H1 therebetween.

The first substrate 11 includes a light-emitting region 110 defined thereon and a load circuit 200 configured in the light-emitting region 110. Furthermore, the first substrate 11 includes a welding region 111, and the welding region 111 is located at a side of the light-emitting region 110 that is father away from the second substrate 12.

The second substrate 12 includes a control region 120 defined thereon and a driving circuit 210 configured in the control region 120.

The light-emitting module 30 is mounted on the first substrate 11 and electrically connected to the load circuit 200. Specifically, the light-emitting module 30 includes a plurality of light-emitting units 31, which are electrically connected to one another through the load circuit 200. In the instant embodiment, the light-emitting units 31 can be electrically connected to one another in series through the load circuit 200.

The driving module 40 is mounted on the second substrate 12 and electrically connected to the driving circuit 210. Specifically, the driving module 40 of the instant embodiment includes a bridge rectifier circuit 41 and a dimming circuit 42. Furthermore, the light-emitting diode package structure P1 further includes two power receiving terminals 50 for being electrically connected to a drive power supply and the two jumper wires 220.

Furthermore, the light-emitting module 30 and the driving module 40 are electrically connected to each other through the electrical connection unit. In one embodiment, the electrical connection unit includes a plurality of conductive connection portions 60a, 60b, and the conductive connection portions 60a, 60b bridge over the isolation trench H1 so as to connect the first substrate 11 to the second substrate 12.

Two power receiving terminals 50 are disposed in the welding region 111 and the two jumper wires 220 respectively extend from two power receiving terminals 50 to the light-emitting region 110 and are electrically connected to two conductive connection portions 60b, respectively. As such, two power receiving terminals 50 can be electrically connected to the driving module 40.

Reference is made to FIG. 6, which is a diagram showing a driving circuit of the light-emitting diode package structure shown in FIG. 5B according to the embodiment of the present disclosure. The dimming circuit 42 includes at least two control chips 420 and a plurality of resistors 421, and the bridge rectifier circuit 41 includes a plurality of rectifiers. In one embodiment, a driving signal (for example, the input voltage of AC 220V) is input by the drive power supply to the bridge rectifier circuit 41 and the dimming circuit 42 through the power receiving terminals 50 and the jumper wires 220. The driving signal is converted into a small direct current (of about 5 to 30 mA) through the bridge rectifier circuit 41 and the dimming circuit 42, and then the small direct current is supplied to the light-emitting units 31 of the light-emitting module 30.

Reference is made to FIG. 5B again. The light-emitting diode package structure P1 further includes an encapsulating layer 70 to protect the light-emitting module 30, the driving module 40, the driving circuit 210 and the load circuit 200. The upper portion 71 of the encapsulating layer 70 covers the light-emitting module 30 and the driving module 40, but the two power receiving terminals 50 are not covered by the encapsulating layer 70 and exposed. The lower portion 72 of the encapsulating layer 70 covers the bottom surface of the substrate assembly 10'.

As mentioned previously, the upper portion 71 includes a first part 711 covering the control region 120 and a second part 712 covering the light-emitting region 110. The material of the first part 711 can be the same as or different from that of the second part 712.

Furthermore, the light-emitting diode package structure P1 further includes an isolation portion 721 disposed in the isolation trench H1. The isolation portion 721 can be made of the same material as a material of the encapsulating layer 70. As mentioned above, the isolation portion 721 can be simultaneously formed in the isolation trench H1 during the formation of the encapsulating layer 70.

Accordingly, since the first substrate 11 and the second substrate 12 are spaced apart from each other, the heat generated respectively by either one of the driving module 40 and the light-emitting module 30 during operation will not cause the operation of the other one of the driving module 40 and the light-emitting module 30 to be adversely affected. Therefore, the luminescence decay rate of the light-emitting units 31 of the light-emitting module 30 can be decreased so that the luminous flux maintenance factor of the light-emitting module 30 and the stability of the driving module 40 can be improved, thereby prolonging the lifetime of the products.

On the other hand, when a welding process is performed on the welding region 111, the temperature for welding is usually higher than 1000° C. In the light-emitting diode package structure of the embodiment of the present disclosure, since the first substrate 11 and the second substrate 12 are spaced apart from each other, an adverse effect resulting from the high welding temperature on the driving module 40 during the welding process can be attenuated. In one embodiment, the second substrate 12 can be disposed adjacent to a side of the first substrate 11 where the welding region 111 is located. As long as the first and second substrates 11, 12 are spaced apart from each other, the same results can be achieved. However, in a preferred embodiment, the welding region 111 is located at a side of the light-emitting region 110 which is farther away from the control region 120 so that the adverse effect resulting from the high welding temperature on the driving module 40 during the welding process can be further attenuated.

Figure 7:
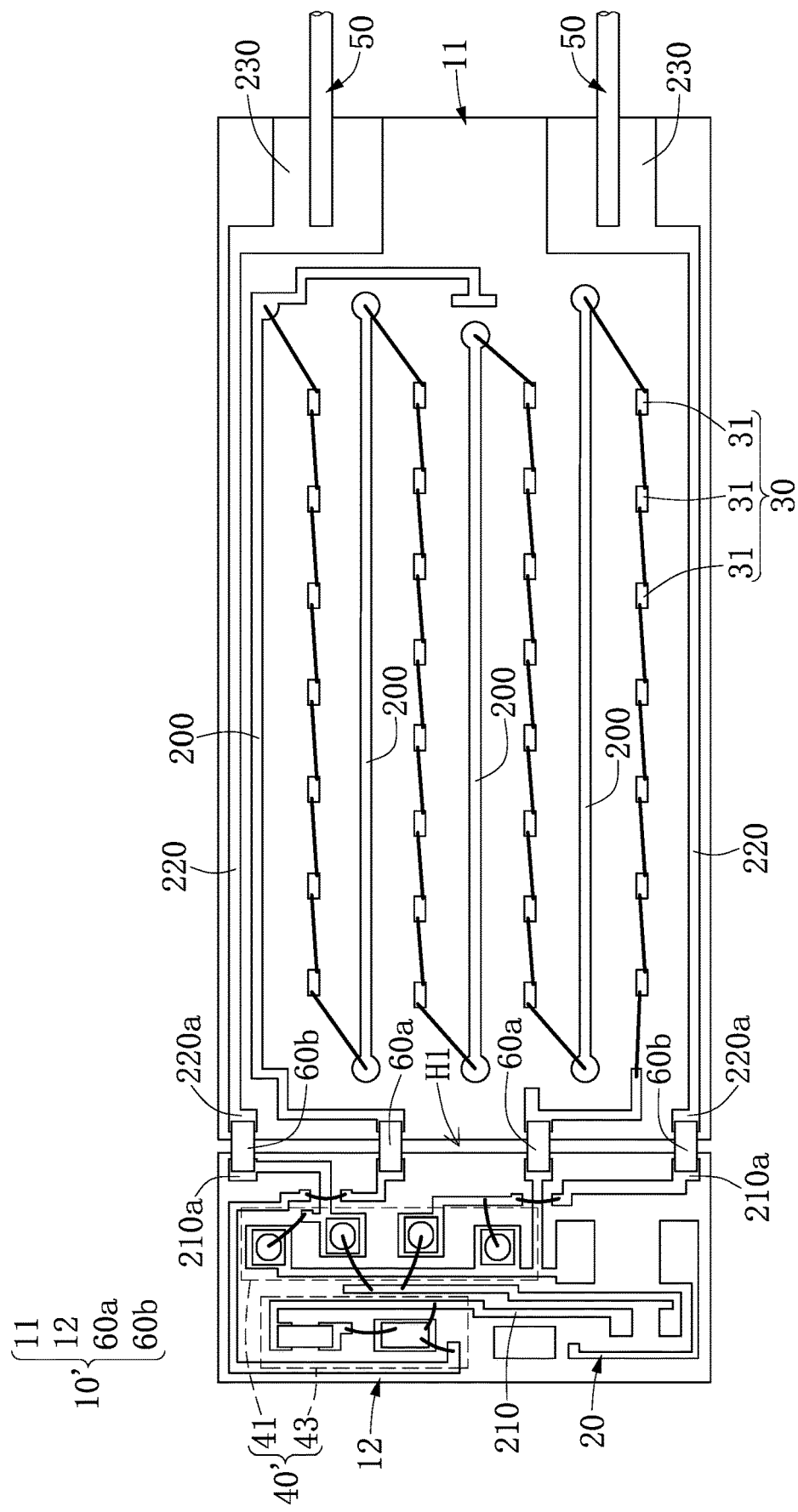
FIG. 7 is a schematic top view of a light-emitting diode package structure before the formation of the encapsulating layer according to another embodiment of the present disclosure.
Figure 8:
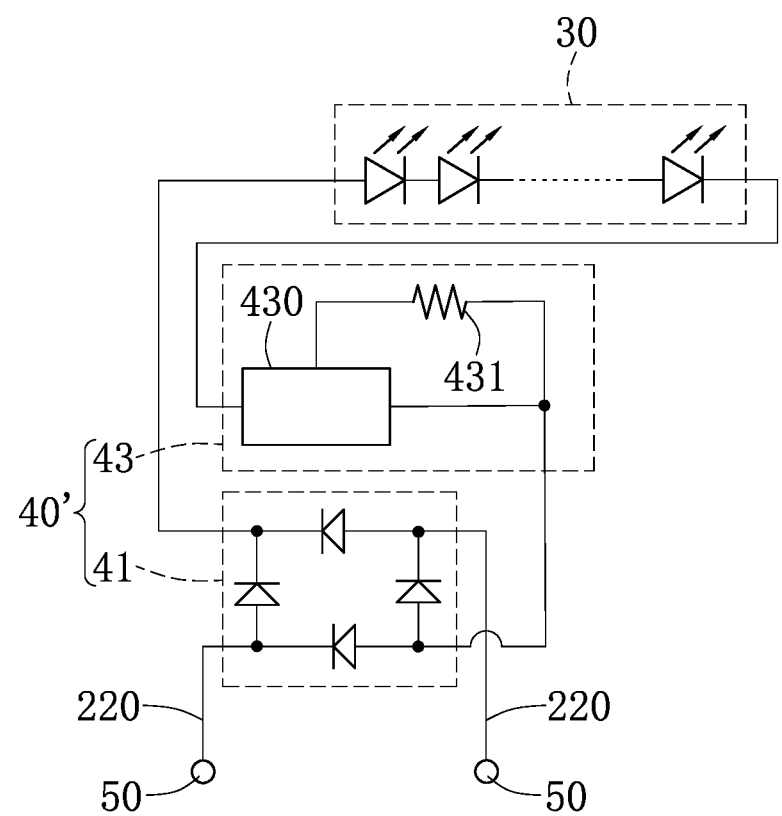
FIG. 8 is a diagram showing a driving circuit of the light-emitting diode package structure shown in FIG. 7 according the embodiment of the present disclosure.

It should be noted that, the dimming circuit 42 of the driving module 40 can be replaced with a general circuit. Reference is made to FIG. 7 and FIG. 8. FIG. 7 is a schematic top view of a light-emitting diode package structure before the formation of the encapsulating layer according to another embodiment of the present disclosure. FIG. 8 is a diagram showing a driving circuit of the light-emitting diode package structure shown in FIG. 7 according the embodiment of the present disclosure. In the instant embodiment, the elements of the light-emitting diode package structure which are similar to or the same as those shown in FIG. 4A are denoted by similar or the same reference numerals.

In the instant embodiment, the light-emitting units 31 of the light-emitting module 30 are electrically connected to one another in series, and the driving module 40' includes a bridge rectifier circuit 41 and a non-dimming circuit 43. The non-dimming circuit 43 includes a control chip 430 and a resistor 431. That is to say, in the light-emitting diode package structure of the instant embodiment of the present disclosure, the control region 120 can be disposed with different driving circuits 210 and different driving modules 40, 40' according to particular requirements and different circuit specifications.

Figure 9:
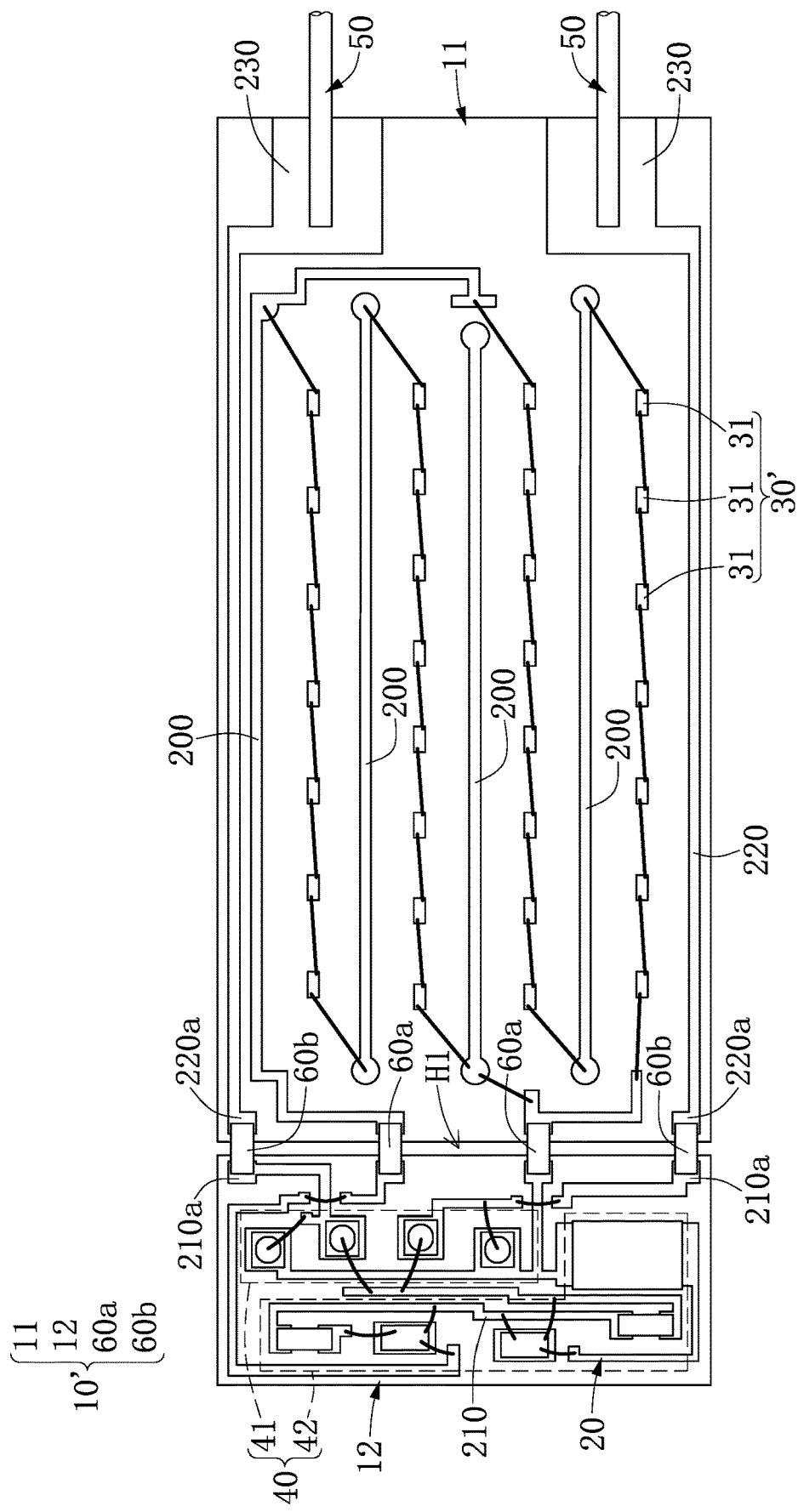
FIG. 9 is a schematic top view of a light-emitting diode package structure before the formation of the encapsulating layer according to yet another embodiment of the present disclosure.
Figure 10:
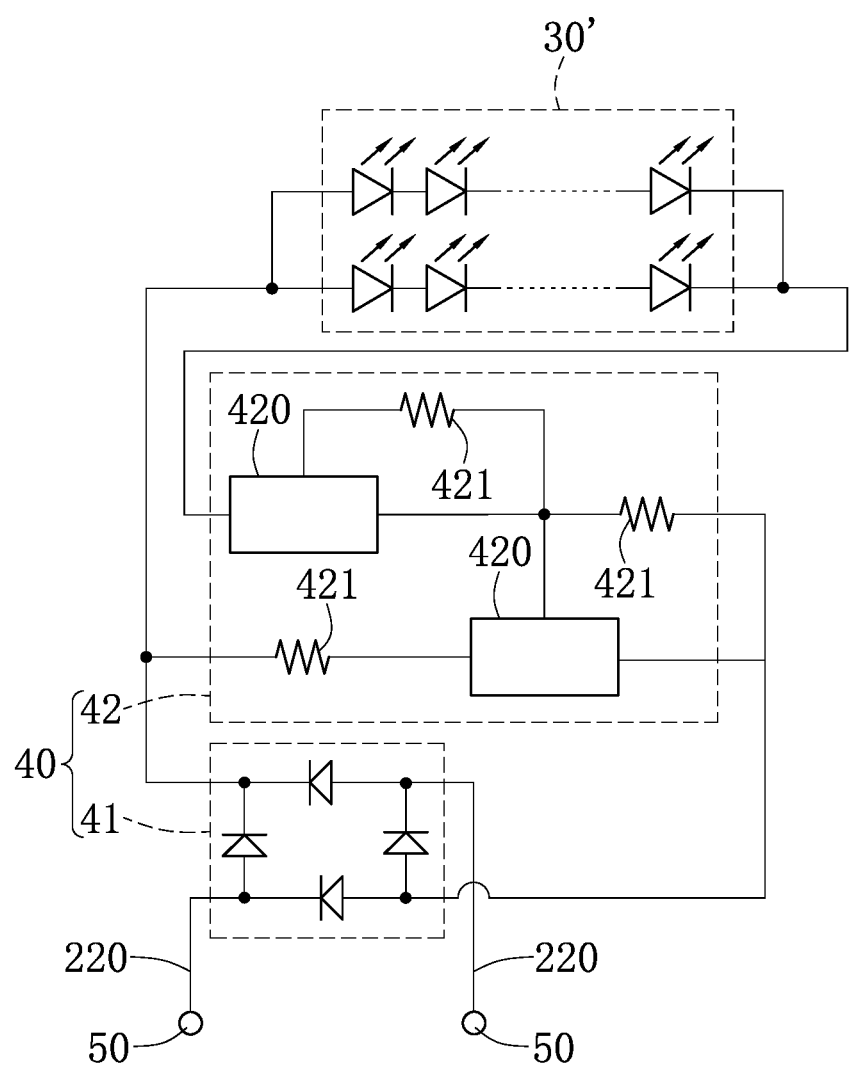
FIG. 10 is a diagram showing a driving circuit of the light-emitting diode package structure shown in FIG. 9 according the embodiment of the present disclosure.

Furthermore, the electrical connections among the light-emitting units 31 of the light-emitting module 30 can be changed according to particular requirements. Reference is made to FIG. 9 and FIG. 10, in which FIG. 10 is a diagram showing a driving circuit of the light-emitting diode package structure shown in FIG. 9. In the instant embodiment, the elements of the light-emitting diode package structure which are similar to or the same as those shown in FIG. 4A are denoted by similar or the same reference numerals.

As shown in FIG. 10, the light-emitting module 30' of the instant embodiment includes two groups which are electrically connected to each other in parallel, and each of the groups includes a plurality of light-emitting units 31 which are electrically connected to one another in series. Reference is made to FIG. 9 again. In the instant embodiment, the layout of the load circuit 200 is the same as that shown in FIG. 4A. However, by changing the arrangements of the bonding wires, the electrical connections among the light-emitting units can be varied.

In the embodiment shown in FIG. 10, the drive power supply inputs a voltage signal of AC 110V to the bridge rectifier circuit 41 and the dimming circuit 42 (the driving module 40) through the power receiving terminals 50 and the jumper wires 220. Thereafter, the dimming circuit 42 can output a small direct current (of about 5 to 30 mA) to the light-emitting units 31 of the light-emitting module 30'.

Figure 11:
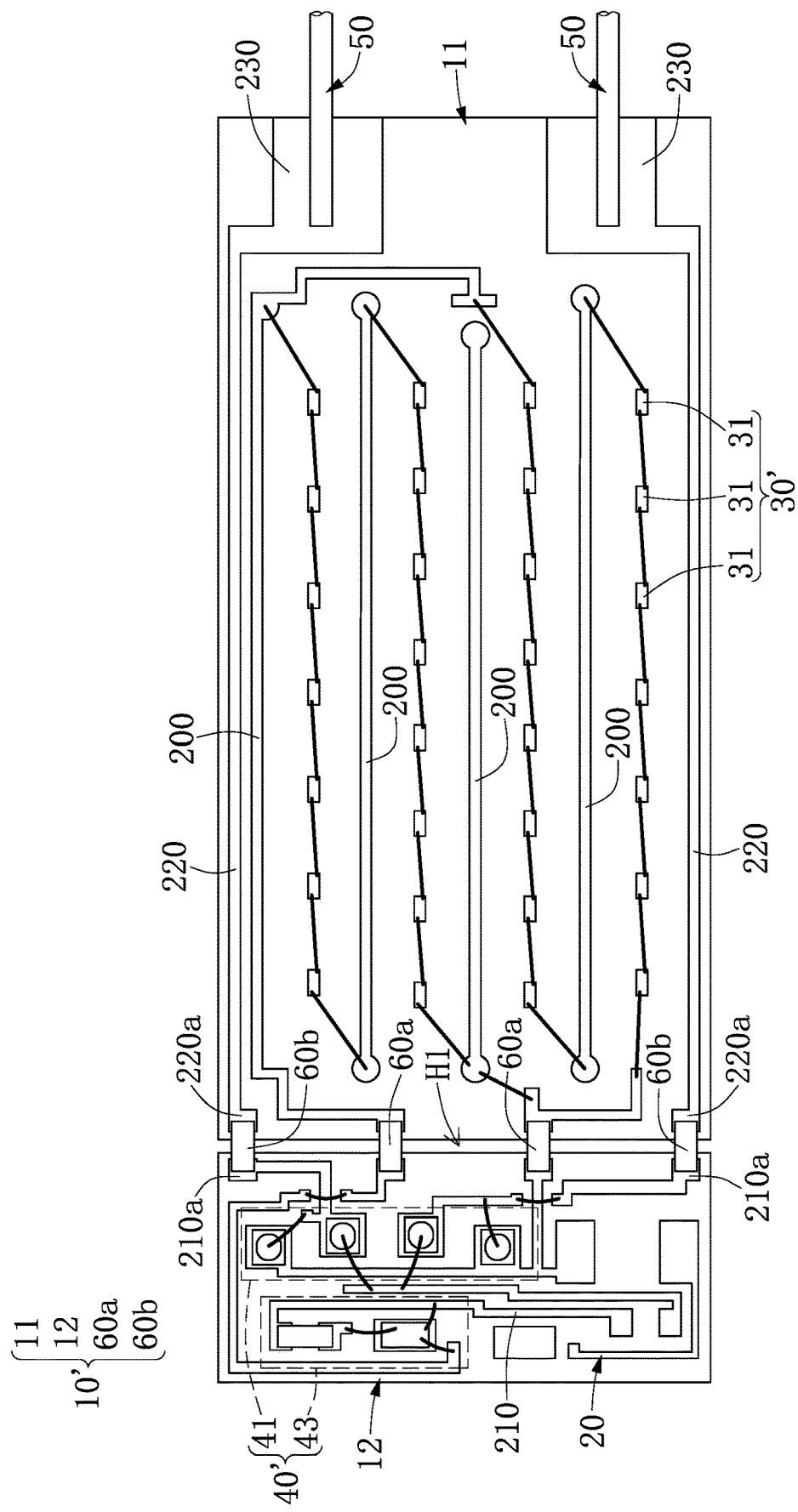
FIG. 11 is a schematic top view of a light-emitting diode package structure before the formation of the encapsulating layer according to yet another embodiment of the present disclosure.
Figure 12:
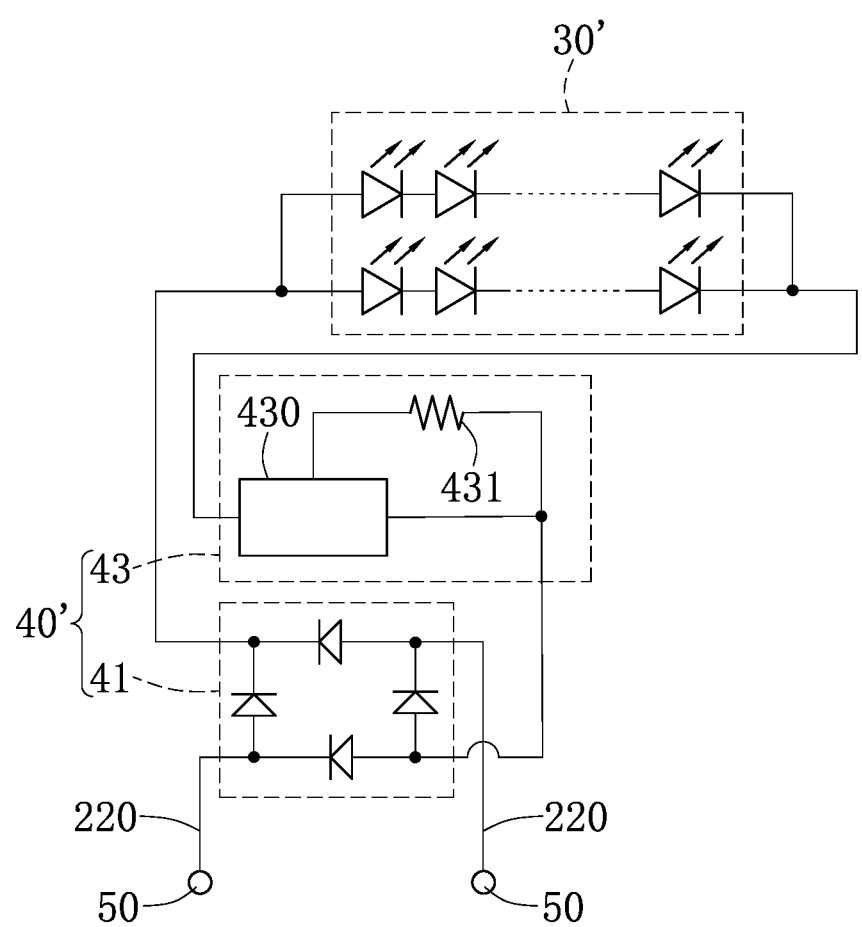
FIG. 12 is a diagram showing a driving circuit of the light-emitting diode package structure shown in FIG. 11 according the embodiment of the present disclosure.

Reference is made to FIG. 11 and FIG. 12. FIG. 12 is a diagram showing a driving circuit of the light-emitting diode package structure shown in FIG. 11 according the embodiment of the present disclosure. In the instant embodiment, the elements of the light-emitting diode package structure which are similar to the same as those shown in FIG. 10 are denoted by similar or the same reference numerals.

In the instant embodiment, the electrical connections among the light-emitting units 31 of the light-emitting module 30' are the same as that shown in FIG. 10. However, the driving module 40' includes the bridge rectifier circuit 41 and the non-dimming circuit 43.

In the instant embodiment, the drive power supply inputs a voltage signal of AC 110V to the bridge rectifier circuit 41 and the non-dimming circuit 43 (the driving module 40') through the power receiving terminals 50 and the jumper wires 220. Thereafter, the driving circuit 40' can output a small direct current (of about 5 to 30 mA) to the light-emitting units 31 of the light-emitting module 30'.

In conclusion, in a light-emitting diode structure package and a manufacturing method thereof provided in any embodiment of the present disclosure, by spacing apart the first substrate 11 where the light-emitting module 30, 30' is disposed from the second substrate 12 where the driving module 40 is disposed, the adverse effects respectively caused by the heat from either of the light-emitting module 30, 30' and the driving module 40 during operation on the other of the light-emitting module 30, 30' and the driving module 40 can be reduced.

Specifically, since the first substrate 11 is spaced apart from the second substrate 12, the heat generated from the bridge rectifier circuit 41 of the driving module 40 during operation may not be directly conducted to the light-emitting region 110, thereby decreasing the luminescence decay rate of the light-emitting units 31 of the light-emitting module 30 and improving the luminous flux maintenance factor of the light-emitting module 30.

On the other hand, since the first substrate 11 is spaced apart from the second substrate 12, the adverse effect due to the heat generated from the light-emitting module 30 during operation on the dimming circuit 42 or the non-dimming circuit 43 of the driving module 40 can be attenuated, thereby improving the stability of the control chip of the dimming circuit 42 (or the non-dimming circuit 43) and prolonging the lifetime of the product.

Furthermore, in the light-emitting diode package structure P1, the welding region 111 is located at the side of the first substrate 11 farther away from the control region 120 so that an adverse effect resulting from the high welding temperature on the driving module 40 during the welding process can be attenuated.

In the manufacturing method of a light-emitting diode package structure, the driving circuit 210 configured in control region 120 and the load circuit 200 configured in light-emitting region 110 can be formed during the same processes. Furthermore, the layouts of the driving circuit 210 and the load circuit 200 in the embodiment of the present disclosure can be designed to be in cooperation with the driving module 30, 30', which may have a dimming circuit 42 or a non-dimming circuit 43, and to receive a voltage signal of AC220V or AC110V.

Accordingly, the light-emitting diode package structure provided in the embodiment of the present disclosure can be directly driven by grid power and has many advantages, such as smaller size, higher luminous efficiency, stability, safety, reliability, and good value. As such, the light-emitting diode package structure provided in the embodiment of the present disclosure can be widely used in different kinds of devices, such as ceiling lamps, downlights, pendant lamps, bulb lights, indicators, reading lamps, flashlights and so on.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light-emitting diode package structure, comprising:
    a first substrate including a light-emitting region and a welding region defined thereon and including a load circuit configured in the light-emitting region;
    a second substrate including a control region defined thereon and a driving circuit configured in the control region, wherein the first substrate and the second substrate are spaced apart from each other, and the welding region is located at a side of the light-emitting region that is farther away from the second substrate;
    a light-emitting module disposed on the first substrate and electrically connected to the load circuit; and
    a driving module disposed on the second substrate and electrically connected to the driving circuit, wherein the driving module is electrically connected to the light-emitting module.

2. The light-emitting diode package structure according to claim 1, further comprising an electrical connection unit, wherein the driving module and the light-emitting module are electrically connected to each other by the electrical connection unit.

3. The light-emitting diode package structure according to claim 2, wherein the electrical connection unit includes a plurality of conductive connection portions, each of the conductive connection portions is connected between the first substrate and the second substrate.

4. The light-emitting diode package structure according to claim 3, wherein the load circuit includes a plurality of first pads which are disposed adjacent to the second substrate, the driving circuit includes a plurality of second pads, the first pads respectively correspond to the second pads, and two ends of at least one of the conductive connection portions are respectively connected to the corresponding one of the first pads and the corresponding one of the second pads such that the at least one of the conductive connection unit is bonded to the first and second substrates.

5. The light-emitting diode package structure according to claim 1, further includes two power receiving terminals for being electrically connected to a drive power supply and two jumper wires, wherein the two power receiving terminals are disposed in the welding region, and the two jumper wires extend respectively from the two power receiving terminals to the light-emitting region and are electrically connected to the electrical connection units so as to be electrically connected to the driving circuit.

6. The light-emitting diode package structure according to claim 5, wherein the driving module further includes a bridge rectifier circuit configured in the control region and electrically connected to the driving circuit, and two terminals of the bridge rectifier circuit are electrically connected to the two power receiving terminals through the two jumper wires, respectively.

7. The light-emitting diode package structure according to claim 1, further comprising an encapsulating layer covering the light-emitting module and the driving module.

8. The light-emitting diode package structure according to claim 7, wherein the encapsulating layer includes a first part covering the control region and a second part covering the light-emitting portion, the first part is made of phosphor adhesive, transparent adhesive, or opaque adhesive, and the second part is made of phosphor adhesive or transparent adhesive.

9. The light-emitting diode package structure according to claim 7, wherein an isolation trench is defined between the first substrate and the second substrate, the light-emitting diode package structure further includes an isolation portion located in the isolation trench, and the material of the isolation portion is the same as that of the encapsulating layer.

10. The light-emitting diode package structure according to claim 1, wherein an isolation trench is defined between the first substrate and the second substrate, and the isolation trench is filled with air.

11. A light-emitting diode package structure, comprising:
- a first substrate including a light-emitting region and a welding region defined thereon and including a load circuit configured in the light-emitting region;
- a second substrate including a control region defined thereon and a driving circuit configured in the control region, wherein the first substrate and the second substrate are spaced apart from each other, and the welding region is located at a side of the light-emitting region that is farther away from the second substrate;
- a light-emitting module disposed on the first substrate and electrically connected to the load circuit;
- a driving module disposed on the second substrate and electrically connected to the driving circuit, wherein the driving module is electrically connected to the light-emitting module; and
- an electrical connection unit, wherein the driving module and the light-emitting module are electrically connected to each other by the electrical connection unit.

12. A light-emitting diode package structure, comprising:
- a first substrate including a light-emitting region defined thereon and a load circuit configured in the light-emitting region, wherein the load circuit includes a plurality of first pads which are disposed adjacent to the second substrate;
- a second substrate including a control region defined thereon and a driving circuit configured in the control region, wherein the first substrate and the second substrate are spaced apart from each other, and wherein the driving circuit includes a plurality of second pads, and the first pads respectively correspond to the second pads;
- a light-emitting module disposed on the first substrate and electrically connected to the load circuit;
- a driving module disposed on the second substrate and electrically connected to the driving circuit, wherein the driving module is electrically connected to the light-emitting module; and
- an electrical connection unit, wherein the driving module and the light-emitting module are electrically connected to each other by the electrical connection unit;
- wherein the electrical connection unit includes a plurality of conductive connection portions, each of the conductive connection portions is connected between the first substrate and the second substrate;
- wherein two ends of at least one of the conductive connection portions are respectively connected to the corresponding one of the first pads and the corresponding one of the second pads such that the at least one of the conductive connection unit is bonded to the first and second substrates.

* * * * *